US011339311B2

(12) United States Patent
Ito et al.

(10) Patent No.: US 11,339,311 B2
(45) Date of Patent: May 24, 2022

(54) POLISHING COMPOSITION

(71) Applicant: FUJIMI INCORPORATED, Kiyosu (JP)

(72) Inventors: Yasuaki Ito, Kiyosu (JP); Naoto Noguchi, Kiyosu (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 16/961,619

(22) PCT Filed: Dec. 21, 2018

(86) PCT No.: PCT/JP2018/047189
§ 371 (c)(1),
(2) Date: Jul. 10, 2020

(87) PCT Pub. No.: WO2019/138846
PCT Pub. Date: Jul. 18, 2019

(65) Prior Publication Data
US 2020/0399505 A1 Dec. 24, 2020

(30) Foreign Application Priority Data

Jan. 11, 2018 (JP) .............................. JP2018-002847
Sep. 21, 2018 (JP) .............................. JP2018-176787

(51) Int. Cl.
*C09G 1/02* (2006.01)
*H01L 21/306* (2006.01)
*H01L 29/16* (2006.01)
*H01L 29/20* (2006.01)

(52) U.S. Cl.
CPC .......... *C09G 1/02* (2013.01); *H01L 21/30625* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| 4,705,594 A | 11/1987 | Zobbi et al. |
| 6,332,831 B1 * | 12/2001 | Shemo ................ C09G 1/02 106/3 |
| 2002/0194789 A1 * | 12/2002 | Oshima ................ C09G 1/02 51/308 |
| 2004/0127147 A1 * | 7/2004 | Suenaga ............. C09K 3/1409 451/36 |
| 2005/0056368 A1 | 3/2005 | Schroeder et al. |
| 2006/0261306 A1 * | 11/2006 | Li ...................... C09K 3/1409 252/79.1 |
| 2008/0057832 A1 | 3/2008 | Schroeder et al. |
| 2008/0153292 A1 * | 6/2008 | White ................... C09G 1/02 438/692 |
| 2013/0092871 A1 | 4/2013 | Sekiguchi et al. |
| 2014/0057438 A1 | 2/2014 | Yoshida et al. |
| 2014/0124793 A1 * | 5/2014 | Singh ................... C09G 1/02 257/77 |
| 2014/0220299 A1 | 8/2014 | Yoshida et al. |
| 2015/0218709 A1 * | 8/2015 | Yoshizaki ......... H01L 21/30625 252/79.2 |
| 2016/0325398 A1 * | 11/2016 | Fujimoto .......... H01L 21/02024 |
| 2017/0283987 A1 | 10/2017 | Yoshida et al. |
| 2017/0342298 A1 | 11/2017 | Yoshida et al. |
| 2019/0112506 A1 | 4/2019 | Ishibashi |
| 2020/0109313 A1 | 4/2020 | Ito et al. |

FOREIGN PATENT DOCUMENTS

| CN | 102947919 A | 2/2013 |
| CN | 103493183 A | 1/2014 |
| CN | 104109480 A | 10/2014 |
| CN | 106398544 A | 2/2017 |
| JP | 2917066 B2 | 4/1999 |
| JP | 2000248265 A | 9/2000 |
| JP | 2012253259 A | 12/2012 |
| JP | 2014-44982 A | 3/2014 |
| JP | 5449248 B2 | 3/2014 |
| JP | 2016194006 A | 11/2016 |
| JP | 2017179221 A | 10/2017 |
| WO | 2010017693 A1 | 2/2010 |
| WO | 2012147605 A1 | 11/2012 |
| WO | 2013051555 A1 | 4/2013 |
| WO | 2017212971 A1 | 12/2017 |
| WO | 2018174008 A1 | 9/2018 |

OTHER PUBLICATIONS

International Preliminary Report on Patentability of PCT Application No. PCT/JP2018/047189, dated Jul. 23, 2020.
First Office Action for CN Application No. 201880086133.1, dated Feb. 19, 2021.
Second Office Action for CN Application No. 201880086133.1, dated Jul. 30, 2021.
Extended European Search Report for European Application No. 18900274.4 dated Jan. 4, 2022.

* cited by examiner

*Primary Examiner* — Shamim Ahmed
(74) *Attorney, Agent, or Firm* — Katten Muchin Rosenman LLP

(57) ABSTRACT

The present invention provides a polishing composition with which polishing rates can be effectively improved and which is for polishing works to be polished. The polishing composition comprises water, abrasive grains, an oxidant, and a polishing accelerator. The polishing accelerator comprises at least one metal salt selected from the group consisting of alkali metal salts and alkaline-earth metal salts.

15 Claims, No Drawings

POLISHING COMPOSITION

CROSS-REFERENCE TO RELATED APPLICATIONS

The present application is a U.S. National Stage entry of International Application No. PCT/JP2018/047189, filed Dec. 21, 2018, the entire contents of which are incorporated herein by reference for all purposes.

TECHNICAL FIELD

The present invention relates to a polishing composition, and specifically, to a polishing composition used for polishing an object to be polished.

The present application claims priority based on Japanese Patent Application No. 2018-2847 filed on 11 Jan. 2018 and Japanese Patent Application No. 2018-176787 filed on 21 Sep. 2018, the entire contents of which application are incorporated herein by reference.

BACKGROUND ART

The surface of a material to be polished such as diamond, sapphire (aluminum oxide), silicon carbide, boron carbide, tungsten carbide, silicon nitride, and titanium nitride is generally processed by lapping (polishing that is performed by supplying a diamond abrasive to polishing platen). However, in lapping using diamond abrasive, defects and strains are likely to occur due to the generation and remaining of scratches and the like. Therefore, after lapping using diamond abrasive or in place of the lapping, polishing in which a polishing pad is used and a polishing slurry is supplied between the polishing pad and an object to be polished is studied. Examples of literature in which this type of the related art is disclosed include Patent Literatures 1 to 6.

CITATION LIST

Patent Literature

Patent Literature 1: WO 2013/051555
Patent Literature 2: Japanese Patent Application Publication No. 2012-253259
Patent Literature 3: U.S. Pat. No. 4,705,594
Patent Literature 4: Japanese Patent No. 2917066
Patent Literature 5: Japanese Patent Application Publication No. 2000-248265
Patent Literature 6: Japanese Patent No. 5449248

SUMMARY OF INVENTION

Technical Problem

Patent Literature 1 proposes adding an acid to a polishing composition used for polishing a silicon carbide single crystal substrate to lower pH. This literature describes that such a configuration enables a sufficient polishing rate. However, a polishing machine and a peripheral member may be damaged due to a polishing composition having a low pH. There is a demand for a polishing composition that can realize a high polishing removal rate regardless of pH.

The present invention has been made in view of the above circumstances and a main object of the present invention is to provide a polishing composition that can effectively improve a polishing removal rate in polishing of an object to be polished. Another related object is to provide a method of polishing an object to be polished using the polishing composition.

Solution to Problem

According to the present invention, a polishing composition used for polishing an object to be polished is provided. The polishing composition contains water, an abrasive, an oxidant, and a polishing removal accelerator. The polishing composition contains at least one metal salt selected from the group consisting of an alkali metal salt and an alkaline earth metal salt as the polishing removal accelerator. Since a polishing composition containing an alkali metal salt and/or an alkaline earth metal salt as the polishing removal accelerator is used in this manner, a high polishing removal rate can be realized.

In a preferred aspect of the polishing composition disclosed here, the concentration $C_1$ [mol/L] of the metal salt and the concentration $C_2$ [mol/L] of the oxidant in the polishing composition satisfy the following relationships: $0.0035 \leq C_1$; $0.001 \leq C_1/C_2 \leq 1$. The polishing removal accelerator and the oxidant are used in combination so that a specific concentration ratio is obtained, and thus a polishing removal rate improving effect can be more suitably exhibited.

In a preferred aspect of the polishing composition disclosed here, the oxidant includes a composite metal oxide. The composite metal oxide includes a monovalent or divalent metal element other than transition metal elements, and a transition metal element in the fourth period in the periodic table. When the oxidant including such a composite metal oxide is contained, a polishing removal rate of the polishing composition can be greatly improved.

In a preferred aspect of the polishing composition disclosed here, the abrasive is alumina particles. In polishing using alumina particles as an abrasive, when the metal salt and the oxidant are used, a polishing removal rate improving effect can be more suitably exhibited.

In a preferred aspect of the polishing composition disclosed here, the oxidant is potassium permanganate. In polishing using potassium permanganate as an oxidant, when the metal salt and the oxidant are used, a polishing removal rate improving effect can be more suitably exhibited. In addition, other examples of an oxidant include sodium periodate. Even if this sodium periodate is used, a polishing removal rate improving effect can be suitably exhibited.

In a preferred aspect of the polishing composition disclosed here, a construction material of the object to be polished has a Vickers hardness of 1,500 Hv or higher. In the polishing composition in which the material to be polished is a material having a high hardness, the application effect of the present invention can be more suitably exhibited.

In a preferred aspect of the polishing composition disclosed here, a construction material of the object to be polished is silicon carbide. In the polishing composition in which the material to be polished is silicon carbide, the application effect of the present invention can be more suitably exhibited. In addition, examples of other preferable materials to be polished include gallium nitride. The effects of the polishing composition disclosed here can be suitably exhibited even when the material to be polished is gallium nitride.

In addition, according to the present invention, a method of polishing an object to be polished is provided. The polishing method includes supplying any of the polishing compositions disclosed here to an object to be polished and polishing the object to be polished. According to the polishing method, it is possible to efficiently provide an object to be polished that is polished (polished object).

DESCRIPTION OF EMBODIMENTS

Preferred embodiments of the present invention will be described below. Incidentally, matters that is other than those particularly mentioned herein but are necessary for implementation of the present invention can be recognized by those skilled in the art as design matters based on the prior art in the relevant field. The present invention can be implemented based on content disclosed herein and common general technical knowledge in the field.

<Object to be Polished>

A polishing composition disclosed here can be applied for polishing an object to be polished made of a material containing no oxygen as a constituting element. Since it is thought that an object to be polished is altered with an oxidant, and the altered layer is removed, and thus polishing proceeds, the object to be polished is preferably a material that is not oxidized. Examples of a construction material of an object to be polished include a monoelemental semiconductor or a monoelemental insulator such as silicon, germanium, and diamond; a ceramic material such as silicon nitride, tantalum nitride, and titanium carbide; a semiconductor substrate material of Groups IIB-VIB (Groups 12-16) compounds such as cadmium telluride, zinc selenide, cadmium sulfide, cadmium mercury telluride, and zinc cadmium telluride; a semiconductor substrate material of Groups IIIB-VB (Groups 13-15) compounds such as gallium nitride, gallium arsenide, gallium phosphide, indium phosphide, aluminum gallium arsenide, indium gallium arsenide, indium gallium arsenide nitride, and aluminum gallium indium phosphide; a semiconductor substrate material of Groups IVB-IVB (Groups 14-14) compounds such as silicon carbide, and germanium silicide; and the like. An object to be polished made of a plurality of materials among them may be used. Among them, it is preferably used for polishing a material having a Vickers hardness of 500 Hv or higher. A Vickers hardness of a material to be polished is preferably 700 Hv or higher, for example 1,000 Hv or higher, and typically 1,500 Hv or higher. The upper limit of the Vickers hardness is not particularly limited, and may be about 7,000 Hv or lower, for example, 5,000 Hv or lower, and typically 3,000 Hv or lower. Herein, the Vickers hardness can be measured based on JIS R 1610:2003. The international standard corresponding to the JIS standard is ISO 14705:2000.

Examples of a material having a Vickers hardness of 1,500 Hv or higher include diamond, silicon carbide, silicon nitride, titanium nitride, gallium nitride and the like. The polishing composition disclosed here can be preferably applied to a single crystal surface of the material that is mechanically and chemically stable. Among them, the surface of the object to be polished is preferably made of any of diamond, silicon carbide, and gallium nitride, and more preferably made of silicon carbide. Silicon carbide is expected to be a semiconductor substrate material having low power loss and excellent heat resistance and the like, and has a particularly large practical advantage of improving surface properties. The polishing composition disclosed here is particularly preferably applied to a single crystal surface of silicon carbide. In addition, the polishing composition disclosed here is particularly preferably applied to a single crystal surface of gallium nitride.

<Polishing Composition>

(Metal Salt A)

The polishing composition disclosed here contains at least one metal salt A selected from the group consisting of an alkali metal salt and an alkaline earth metal salt as a polishing removal accelerator. In polishing, the oxidant causes a surface of a material to be polished to be altered, and the altered layer is removed due to friction with an abrasive, a polishing pad, and the like. In a particularly preferred aspect, the surface of the material to be polished is a surface of a material having a high hardness that contains no oxygen such as silicon carbide or gallium nitride. It is thought that the metal salt A exhibits a catalytic action for promoting the alteration and removal, and contributes to improvement of a polishing removal rate. Here, the altered layer is, for example, a layer containing an oxide layer, and the catalytic action is, for example, an action for dissolving an oxide layer. However, the present invention is not limited only to the above reasons. In addition, the polishing composition disclosed here can also exhibit the effects of reducing defects such as scratches and latent defects, and improving the quality of the surface of the object to be polished. Typically, the metal salt A preferably contains any one or two or more elements among lithium (Li), sodium (Na), potassium (K), rubidium (Rb), cesium (Cs), magnesium (Mg), calcium (Ca), strontium (Sr), and barium (Ba). Among them, any of Na, K, Ca, and Sr is preferable. In some aspects, the metal salt A is an alkali metal salt. The alkali metal salt is unlikely to cause aggregation of abrasives starting from ions of the metal. Therefore, in the polishing composition containing abrasives, more favorable polishing characteristics can be obtained. In addition, in some aspects, the metal salt A is an alkaline earth metal salt. Since ions of the metal of the alkaline earth metal salt are unlikely to diffuse, metal contamination of the object to be polished can be reduced. Therefore, a more favorable polished object can be obtained.

In the metal salt A, the type of salt is not particularly limited, and an inorganic acid salt or an organic acid salt may be used. Examples of the inorganic salt include salts of hydroharogenic acid, such as hydrochloric acid, hydrobromic acid, and hydrofluoric acid, nitric acid, sulfuric acid, carbonic acid, silicic acid, boric acid, phosphoric acid and the like. In addition, examples of the organic salt include salts of carboxylic acid, such as formic acid, acetic acid, propionic acid, benzoic acid, glycine acid, butyric acid, citric acid, tartaric acid, and trifluoroacetic acid; organic sulfonic acid, such as methanesulfonic acid, trifluoromethanesulfonic acid, benzenesulfonic acid, and toluenesulfonic acid; organic phosphonic acid, such as methyl phosphonic acid, benzene phosphonic acid, and toluene phosphonic acid; organic phosphoric acid, such as ethyl phosphoric acid; and the like. Among them, salts of hydrochloric acid, nitric acid, sulfuric acid, silicic acid, boric acid, and phosphoric acid are preferable, and salts of hydrochloric acid and nitric acid are more preferable.

Specific examples of the metal salt A include metal salts A substantially composed of any of chlorides such as lithium chloride, sodium chloride, potassium chloride, magnesium chloride, calcium chloride, strontium chloride, and barium chloride; bromides such as sodium bromide, potassium bromide, and magnesium bromide; fluorides such as lithium fluoride, sodium fluoride, potassium fluoride, magnesium fluoride, calcium fluoride, strontium fluoride, and barium fluoride; nitrates such as lithium nitrate, sodium nitrate, potassium nitrate, magnesium nitrate, calcium nitrate, strontium nitrate, and barium nitrate; sulfates such as lithium sulfate, sodium sulfate, potassium sulfate, magnesium sulfate, calcium sulfate, strontium sulfate, and barium sulfate; carbonates such as potassium carbonate, potassium hydrogen carbonate, sodium carbonate, sodium hydrogen carbonate, magnesium carbonate, calcium carbonate, strontium carbonate, and barium carbonate; borates such as sodium borate; and acetates such as potassium acetate, sodium acetate, calcium acetate, and strontium acetate. The metal salt A may be used singly or in combination of two or more types.

The metal salt A may be dissolved in the polishing composition and may be dispersed as a solid. That is, the metal salt A may be water-soluble or non-water soluble. In addition, in the polishing composition, some of the metal salt A may be dissolved, and the remainder may be dispersed as a solid. In a preferred embodiment, the metal salt A is a water-soluble salt. When the water-soluble metal salt A is used and a polishing composition contains substantially no solid component, a favorable surface with few defects such as scratches can be efficiently formed. In addition, in a preferred embodiment, the metal salt A may be one such that an aqueous solution in which the metal salt A is dissolved in water exhibits a neutral range, and typically a normal salt that is generated by neutralization of a strong acid and a strong base. When the metal salt A in which an aqueous solution exhibits a neutral range is used, a high-quality surface in which the number of defects such as scratches is further reduced can be efficiently formed. The neutral range here means that, for example, the pH (5% aqueous solution, 25° C.) is 4 or more and 9 or less, and preferably, the pH is 4 or more and 8 or less. Examples of the metal salt A in which an aqueous solution is neutral include chlorides such as sodium chloride, potassium chloride, calcium chloride, and strontium chloride, and nitrates such as sodium nitrate, potassium nitrate, calcium nitrate, and strontium nitrate. Among them, calcium chloride, strontium chloride, potassium chloride, sodium chloride, and calcium nitrate are preferable because a favorable surface can be efficiently formed. In some aspects, the metal salt A is an alkali metal chloride or nitrate. In addition, in some aspects, the metal salt A is an alkaline earth metal chloride or nitrate.

A concentration (content) C1 of the metal salt A in the polishing composition is not particularly limited, and is generally appropriately 10 mol/L or lower. When the concentration C1 of the metal salt A is reduced, a polishing removal rate improving effect and a defect reducing effect on the surface of a material to be polished can be achieved at a higher level. In a particularly preferred aspect, the material to be polished is a material having a high hardness. In consideration of polishing removal rate and the like, the concentration C1 is appropriately 10 mol/L or less, preferably 8 mol/L or less, and more preferably 6 mol/L or less, for example, 3 mol/L or less or 1.5 mol/L or less. In some aspects, the concentration C1 of the metal salt A may be 1 mol/L or less, 0.5 mol/L or less, 0.1 mol/L or less, 0.05 mol/L or less, 0.02 mol/L or less, or 0.016 mol/L or less. The lower limit of the concentration C1 is not particularly limited as long as it exceeds 0 (zero), and from the viewpoint that the effects of the present invention to be easily exhibited, the concentration C1 is generally appropriately 0.0001 mol/L or higher, preferably 0.0005 mol/L or higher, more preferably 0.001 mol/L or higher, and even more preferably 0.003 mol/L or higher. The concentration C1 may be, for example, 0.0035 mol/L or higher, 0.005 mol/L or higher, and typically 0.01 mol/L or higher, for example, 0.03 mol/L or higher. In the art disclosed here, for example, an embodiment in which the concentration C1 of the metal salt A in the polishing composition is 0.003 mol/L to 1.5 mol/L or 0.0035 mol/L to 1 mol/L can be preferably performed.

(Oxidant)

The polishing composition disclosed here contains an oxidant in addition to the metal salt A. The oxidant can cause an oxidation reaction with the surface of the object to be polished in polishing and can effectively make the hardness reduction and embrittlement of the surface. When such an oxidant and the metal salt A are used in combination, it is possible to improve a polishing removal rate more effectively. In addition, the oxidant and the metal salt A used in combination may be advantageous for reducing defects. The oxidant is not particularly limited as long as it is a substance having an oxidation-reduction potential sufficient to exhibit an action of oxidizing the surface of the object to be polished. For example, the oxidant may be a substance having an oxidation-reduction potential higher than the oxidation-reduction potential of the material to be polished at a pH at which polishing is performed, that is, at the same pH as that of the polishing composition. Meanwhile, for example, the metal salt A may be a substance having an oxidation-reduction potential lower than the oxidation-reduction potential of the material to be polished at a pH at which polishing is performed, that is, at the same pH as that of the polishing composition. Here, for the oxidation-reduction potential of the material to be polished, a value obtained is adopted when powder of the material is dispersed in water to form a slurry, the slurry is adjusted to the same pH as that of the polishing composition, and an oxidation-reduction potential (an oxidation-reduction potential with respect to a standard hydrogen electrode at a liquid temperature of 25° C.) of the slurry is then measured using a commercially available oxidation-reduction potentiometer.

Specific examples of the oxidant include peroxides such as hydrogen peroxide; nitrate compounds such as nitric acid, salts thereof including iron nitrate, silver nitrate, aluminum nitrate, and complexes thereof including cerium ammonium nitrate; persulfate compounds such as persulfuric acid including peroxomonosulfuric acid, peroxodisulfuric acid and the like, and salts thereof including persulfate ammonium, persulfate potassium and the like; chlorine-containing compounds such as chloric acid and salt thereof, perchloric acid and salt there of including potassium perchlorate; bromine-containing compounds such as bromic acid and salt thereof including potassium bromate; iodine-containing compounds such as iodic acid and salts thereof including ammonium iodate, and periodic acid and salts thereof including sodium periodate and potassium periodate; ferric acids such as ferric acid and salts thereof including potassium ferrate; permanganic acids such as permanganic acid and salts thereof including sodium permanganate and potassium permanganate; chromic acids such as chromic acid and salts thereof including potassium chromate and potassium dichromate; vanadic acids such as vanadic acid and salts thereof including ammonium vanadate, sodium vanadate, and potassium vanadate; ruthenic acids such as perruthenic acid and salts thereof; molybdic acids such as molybdic acid and salts thereof including ammonium molybdate and disodium molybdate; rhenium acids such as perrhenic acid and salts thereof; and tungstic acids such as tungstic acid and salts thereof including disodium tungstate. These may be used singly or in combination of two or more types appropriately.

In a preferred embodiment, the polishing composition contains a composite metal oxide as an oxidant. Examples of the composite metal oxide include nitrate metal salts, ferric acids, permanganic acids, chromic acids, vanadic acids, ruthenic acids, molybdic acids, rhenium acids, and tungstic acids. Among them, ferric acids, permanganic acids, and chromic acids are more preferable, and permanganic acids is even more preferable.

In a more preferred embodiment, a composite metal oxide including a monovalent or divalent metal element other than transition metal elements, and a transition metal element in the fourth period in the periodic table is used as the composite metal oxide. Preferred examples of the monovalent or divalent metal element include Na, K, Mg, and Ca. Among them, Na and K are more preferable. Preferred examples of the transition metal element in the fourth period in the periodic table include Fe, Mn, Cr, V, and Ti. Among them, Fe, Mn, and Cr are more preferable, and Mn is even more preferable. The composite metal oxide can effectively reduce the hardness of the surface and cause embrittlement in the surface of a material having a high hardness such as silicon carbide. Therefore, when the composite metal oxide and the metal salt A are used in combination, the polishing removal rate improving effect and the defect reducing effect can be more suitably exhibited.

When the polishing composition disclosed here contains the composite metal oxide as an oxidant, it may or may not further contain an oxidant other than the composite metal oxide. The art disclosed here can be preferably performed in a mode in which an oxidant other than the composite metal oxide is not substantially contained as the oxidant. Examples of an oxidant other than the composite metal oxide include hydrogen peroxide.

The concentration (content) C2 of the oxidant in the polishing composition is generally appropriately 0.001 mol/L or more. In order to achieve both a high and efficient polishing removal rate and defect reduction, the concentration C2 is preferably 0.005 mol/L or more, and more preferably 0.01 mol/L or more, for example, 0.05 mol/L or more. In addition, in order to improve the smoothness, the concentration C2 of the oxidant is generally appropriately 10 mol/L or less, preferably 5 mol/L or less, and more preferably 3 mol/L or less, for example, 1 mol/L or less, or 0.5 mol/L or less. The art disclosed here can be preferably performed in a mode in which the concentration C2 of the oxidant in the polishing composition is 0.07 mol/L to 0.3 mol/L.

Although there is no particular limitation, in order to exhibit the effects of the oxidant and the metal salt A used in combination more favorably, a ratio (C1/C2) of the concentration C1 [mol/L] of the metal salt A to the concentration C2 [mol/L] of the oxidant in the polishing composition is preferably 0.001 or more, more preferably 0.005 or more, still more preferably 0.01 or more, and particularly preferably 0.02 or more in order to more favorably exhibit the effects of the present invention. In some aspects, C1/C2 may be, for example, 0.08 or more, and typically 0.12 or more. The upper limit of C1/C2 is not particularly limited, but is preferably about 100 or less. C1/C2 is typically 70 or less, preferably 30 or less, more preferably 10 or less, still more preferably 1 or less, and particularly preferably 0.2 or less. In some aspects, C1/C2 may be, for example, 0.18 or less, typically 0.15 or less. At such a ratio (C1/C2) of the concentration of the metal salt A to the concentration of the oxidant, the polishing removal rate improving effect can be more suitably exhibited. Here, when the polishing composition contains a plurality of metal salts A, the concentration of the metal salt A is a total concentration thereof. In addition, when the polishing composition contains a plurality of oxidants, the concentration of the oxidant is a total concentration thereof (Abrasive)

The polishing composition disclosed here contains an abrasive. The material and properties of the abrasive are not particularly limited. For example, the abrasive can be any of inorganic particles, organic particles, and organic-inorganic composite particles. Examples thereof include abrasives substantially composed of any one of oxide particles such as silica particles, alumina particles, cerium oxide particles, chromium oxide particles, titanium dioxide particles, zirconium oxide particles, magnesium oxide particles, manganese dioxide particles, zinc oxide particles, and iron oxide particles; nitride particles such as silicon nitride particles and boron nitride particles; carbide particles such as silicon carbide particles and boron carbide particles; diamond particles; and carbonates such as calcium carbonate and barium carbonate. The abrasives may be used alone or two or more thereof may be used in combination. Among these, oxide particles such as silica particles, alumina particles, cerium oxide particles, chromium oxide particles, zirconium oxide particles, manganese dioxide particles, and iron oxide particles are preferable because they enable a favorable surface to be formed. Among these, alumina particles, zirconium oxide particles, chromium oxide particles, or iron oxide particles are more preferable, and alumina particles are particularly preferable. In the art disclosed here, in polishing using alumina particles as an abrasive, when the metal salt A and an oxidant are used, a polishing removal rate improving effect can be more suitably exhibited.

Here, in this specification, regarding the composition of the abrasive, when it is described as "substantially consisting of X" or "substantially composed of X," this means that the proportion of X (purity of X) in the abrasive is 90% or more based on the weight. In addition, the proportion of X in the abrasive is preferably 95% or more, more preferably 97% or more, and still more preferably 98% or more, for example, 99% or more.

When alumina particles are used as the abrasive, they can be appropriately selected from among various known alumina particles and used. Examples of such known alumina particles include an α-alumina and an intermediate alumina. Here, the intermediate alumina is a general term for alumina particles other than the α-alumina, and specific examples thereof include γ-alumina, δ-alumina, θ-alumina, η-alumina, κ-alumina, and χ-alumina. In addition, a type of alumina called fumed alumina based on classification according to a production method may be used. The type of alumina called fumed alumina is typically alumina fine particles produced when an alumina salt is in a flame at a high temperature. In addition, a type of alumina called colloidal alumina or alumina sol is also included among examples of the known alumina particles. The type of alumina called colloidal alumina or alumina sol is, for example, alumina hydrate such as boehmite. In consideration of processability, it is preferred to include an α-alumina.

When alumina particles are used as an abrasive, a high proportion of alumina particles with respect to the entire abrasive contained in the polishing composition is generally advantageous. For example, a proportion of the alumina particles with respect to the entire abrasive contained in the polishing composition is preferably 70 weight % or more, more preferably 90 weight % or more, and still more preferably 95 weight % or more. In a more preferred aspect, the proportion of the alumina particles is, for example, 95 to 100 weight %.

In addition, the polishing composition disclosed here preferably contains substantially no diamond particles as an abrasive. Due to their high hardness, diamond particles can be a factor limiting the defect reducing effect. In addition, since diamond particles are generally expensive, they cannot be said to be a beneficial material in terms of cost performance, and it is desirable that the dependence on expensive materials such as diamond particles be low in consideration of practicality.

The average secondary particle size of the abrasive is generally 20 nm or more, and in consideration of polishing removal rate and the like, preferably 100 nm or more, and more preferably 200 nm or more, for example, 400 nm or more. The upper limit of the average secondary particle size of the abrasive is appropriately about 5,000 nm or less in order to sufficiently secure the number per unit weight. In order to achieve both a higher degree of the polishing removal rate and the quality of the surface, the average secondary particle size is preferably 3,000 nm or less, and more preferably 2,000 nm or less, for example, 800 nm or less.

For particles having a size of less than 500 nm, for example, the average secondary particle size of the abrasive can be measured as a volume average particle size (volume-based arithmetic average size; Mv) by a dynamic light scattering method using a model "UPA-UT151" (commercially available from Nikkiso Co., Ltd.). In addition, for particles having a size of 500 nm or more, the average secondary particle size of the abrasive can be measured as a volume average particle size by a pore electrical resistance method using a model "Multisizer 3" (commercially available from Beckman Coulter, Inc.).

The abrasive concentration in the polishing composition is generally appropriately 1 weight % or more in consideration of polishing removal rate. In order to improve a polishing removal rate, the abrasive concentration is preferably 3 weight % or more, and more preferably 5 weight % or more. In addition, in order to achieve both a high and efficient polishing removal rate and quality of the surface or obtain favorable dispersibility, the abrasive concentration in the polishing composition is generally appropriately 50 weight % or less, preferably 20 weight % or less, more preferably 10 weight % or less, and still more preferably 8 weight % or less.

(Other Components)

As long as the effects of the present invention are not impaired, the polishing composition disclosed here may further contain, as necessary, known additives that can be used for a polishing composition such as a chelating agent, a thickener, a dispersant, a surface protective agent, a wetting agent, a pH adjusting agent, a surfactant, an organic acid, an inorganic acid, a corrosion inhibitor, an antiseptic agent, and an antifungal agent. The polishing composition is typically a polishing composition for a material having a high hardness, for example, a polishing composition for a silicon carbide substrate. Since the content of the additive may be appropriately set according to the purpose of addition thereof, and does not characterize the present invention, detailed description thereof will be omitted.

Examples of organic acids include aliphatic carboxylic acids such as formic acid, acetic acid and propionic acid, aromatic carboxylic acids such as benzoic acid and phthalic acid, citric acid, oxalic acid, tartaric acid, malic acid, maleic acid, fumaric acid, succinic acid, organic sulfonic acid, organic phosphonic acid, and the like. Examples of inorganic acids include sulfuric acid, nitric acid, hydrochloric acid, and carbonic acid. When an acid is used, the amount used is generally preferably 0.1 weight % or less, more preferably 0.01 weight % or less, and still more preferably 0.001 weight % or less. Alternatively, the polishing composition disclosed here can be a composition that is substantially free of an acid. In the art disclosed here, when the metal salt A and the oxidant are used in combination, in an acid-free polishing composition in a neutral range, the quality of the surface can be improved and the polishing removal rate can be improved.

(Solvent)

The solvent used for the polishing composition is not particularly limited as long as the metal salt A and the oxidant can be dispersed. Regarding the solvent, ion-exchange water (deionized water), pure water, ultrapure water, distilled water, or the like can be preferably used. The polishing composition disclosed here may further contain, as necessary, an organic solvent that can be uniformly mixed with water. The organic solvent is, for example, lower alcohol, lower ketone, or the like. Generally, it is preferable that 90 vol % or more of the solvent contained in the polishing composition is water, it is more preferable that 95 vol % or more, and typically 99 to 100 vol % thereof is water.

The pH of the polishing composition is generally appropriately about 2 to 12. When the pH of the polishing composition is within the above range, a practical polishing removal rate is easily obtained. From the viewpoint of more favorably exhibiting the application effect of the art disclosed here, the pH of the polishing composition is preferably 3 or higher, more preferably 4 or higher, and even more preferably 5.5 or higher. The upper limit of pH is not particularly limited, and is preferably 12 or lower, more preferably 10 or lower, and even more preferably 9.5 or lower. The pH is preferably 3 to 11, more preferably 4 to 10, and further preferably 5 to 9.5. Although there is no particular limitation, it is thought that, when the pH is within a range of 5 to 9.5, both cations and anions in the metal salt A contribute to improvement of a polishing removal rate and defect reduction. Therefore, according to the art disclosed here, in the polishing composition having a pH of 5 to 9.5, a polishing removal rate higher than that of the related art can be achieved. In addition, such a polishing composition causes little damage to a polishing machine and may be easily handled. The pH of the polishing composition may be, for example, 9 or lower, typically 7.5 or lower. In some aspects, the pH may be, for example, less than 7, typically 6.5 or lower.

<Preparation of Polishing Composition>

A method for preparing the polishing composition disclosed here is not particularly limited. For example, the respective components contained in the polishing composition may be mixed using a well-known mixing device such as a blade type stirrer, an ultrasonic disperser, a homomixer or the like. A mode in which these components are mixed is not particularly limited, and, for example, all components may be mixed at once or may be mixed according to an appropriately set order.

The polishing composition disclosed here may be of one-agent type or a multi-agent type including a two-agent type. For example, the polishing composition may be configured to be prepared by mixing a Liquid A containing some of the components constituting the polishing composition, typically, components other than the solvent with a Liquid B containing the remaining components and to be used to polish the object to be polished.

<Concentrate>

The polishing composition disclosed here may be in a concentrated form, that is, a form of a concentrate of the polishing liquid, before it is supplied to the object to be polished. The polishing composition in such a concentrated form is advantageous from the viewpoints of convenience, cost reduction and the like during production, distribution, storage, and the like. The concentration factor can be, for example, about 2 times to 5 times in terms of volume.

The polishing composition in such a concentrated form can be used in a mode in which a polishing liquid is prepared by dilution at a desired timing and the polishing liquid is supplied to an object to be polished. The dilution can be typically performed by adding the above-described solvent to the concentrate and performing mixing. In addition, when the solvent is a mixed solvent, only some of components constituting the solvent may be added and diluted or a mixed solvent containing such constituent components in an amount ratio different from that of the solvent may be added and diluted. In addition, in a multi-agent type polishing composition as will be described below, some agents among these may be diluted and other agents may be then mixed to prepare a polishing liquid or a plurality of agents may be mixed and the resulting mixture may be then diluted to prepare a polishing liquid.

<Polishing Method>

The polishing composition disclosed here can be used for polishing an object to be polished, for example, in an embodiment including the following operations.

That is, a polishing liquid containing any of the polishing compositions disclosed here is prepared. Preparation of the polishing liquid may include preparation of a polishing liquid by performing operations such as concentration adjustment and pH adjustment on the polishing composition. The concentration adjustment is, for example, dilution. Alternatively, the polishing composition may be directly used as a polishing liquid. In addition, in the case of a multi-agent type polishing composition, preparation of the polishing liquid may include mixing such agents, diluting one or a plurality of agents before the mixing, diluting the resulting mixture after the mixing and the like.

Next, the polishing liquid is supplied to the surface of the object to be polished and polished by a general method. For example, an object to be polished is set in a general polishing machine, the polishing liquid is supplied to the surface (surface to be polished) of the object to be polished through a polishing pad of the polishing machine. Typically, while the polishing liquid is continuously supplied, the polishing pad is pressed against the surface of the object to be polished, and they are moved relative to each other. The movement is, for example, rotation. Polishing of the object to be polished is completed through such a polishing step.

According to the description herein, a polishing method in which a material to be polished is polished and a method in which a polished object is produced using the polishing method are provided. The polishing method includes a step of polishing an object to be polished using the polishing composition disclosed here. A polishing method according to a preferred embodiment includes a step of performing preliminary polishing (stock polishing step) and a step of performing final polishing (final polishing step). The stock polishing step herein refers to a step of performing preliminary polishing on an object to be polished. In a typical embodiment, the stock polishing step is a polishing step set immediately before the final polishing step. The stock polishing step may be a single-step of polishing or a polishing step in two or more sub-steps. The final polishing step herein refers to a step of performing final polishing on an object to be polished on which preliminary polishing has been performed and is a polishing step provided at the end, that is, on the most downstream side, among polishing steps performed using a polishing composition. In such a polishing method including a stock polishing step and a final polishing step, the polishing composition disclosed here may be used in the stock polishing step or may be in the final polishing step, or in both the stock polishing step and the final polishing step.

In a preferred embodiment, a polishing step using the polishing composition may be a stock polishing step. The polishing composition disclosed here is suitable as a polishing composition (composition for preliminary polishing) used for the stock polishing step performed on the surface of the material to be polished since a high polishing removal rate can be achieved. When the stock polishing step includes a polishing step of a plurality sub-steps of two or more, a polishing step in two or more sub-steps among these steps can also be performed using any of the polishing compositions disclosed here. The polishing composition disclosed here can be preferably applied for preliminary polishing at a former sub-step, i.e. on an upstream side. For example, it can also be preferably used in an initial stock polishing step, typically the first sub-step polishing, after a lapping step to be described below.

In another preferred aspect, the polishing step using the polishing composition is a final polishing step. The polishing composition disclosed here can be preferably used as a polishing composition (composition for final polishing) used in the final polishing step of the surface of the material to be polished.

The preliminary polishing and the final polishing can be applied to both polishing using a single-side polishing machine and polishing using a double-side polishing machine. In the single-side polishing machine, an object to be polished is adhered to a ceramic plate with wax or the object to be polished is held using a holder called a carrier, and while a polishing composition is supplied, a polishing pad is pressed against one side of the object to be polished, they are moved relative to each other, and thus one side of the object to be polished is polished. The movement is, for example, rotation. In the double-side polishing machine, an object to be polished is held using a holder called a carrier, and while a polishing composition is supplied from above, a polishing pad is pressed against a side opposite to the object to be polished, these are rotated in a relative direction, and thus both sides of the object to be polished are polished at the same time.

The polishing pad used in each polishing step disclosed here is not particularly limited. For example, any polishing pad of a non-woven fabric type, a suede type, a hard foamed polyurethane type, a type containing abrasive, and a type containing no abrasive may be used.

A polished object that is polished by the method disclosed here is typically cleaned after polishing. This cleaning can be performed using an appropriate cleaning solution. A cleaning solution to be used is not particularly limited, and known or conventional ones can be appropriately selected and used.

The polishing method disclosed here may include any other step in addition to the stock polishing step and the final polishing step. Examples of such a step include a lapping step performed before the stock polishing step. The lapping step is a step of polishing an object to be polished by pressing the surface of a polishing platen, for example, a cast iron platen, against an object to be polished. Therefore, in the lapping step, no polishing pad is used. The lapping step is typically performed by supplying abrasive between the polishing platen and the object to be polished. The abrasive is typically diamond abrasive. In addition, the polishing method disclosed here may include an additional step before the stock polishing step or between the stock polishing step and the final polishing step. The additional step is, for example, a cleaning step or a polishing step.

<Method for Producing Polished Object>

The art disclosed here may include a method for producing a polished object including a polishing step using the polishing composition and a polished object produced by the method. The production method is, for example, a method of producing a silicon carbide substrate. That is, according to the art disclosed here, provided is a method for producing a polished object including supplying any of the polishing compositions disclosed here to an object to be polished made of a material to be polished and polishing the object to be polished, and a polished object produced by the method. The production method can be performed by preferably applying details of any of the polishing methods disclosed here. According to the production method, a polished object, for example, a silicon carbide substrate, can be efficiently provided.

EXAMPLES

Several examples relating to the present invention will be described below, but the present invention is not intended to be limited to those indicated in the examples. Here, in the following description, "%" is on a weight basis unless otherwise specified.

Test Examples

<Preparation of Polishing Composition>

Example 1

The metal salt A as a polishing removal accelerator, potassium permanganate ($KMnO_4$) as an oxidant, an alumina abrasive and deionized water were mixed to prepare a polishing composition of Example 1. The content of the alumina abrasive was 6%. In addition, the average primary particle size of the alumina abrasive based on the specific surface area measured by a BET method was 0.5 µm. Here, the specific surface area was measured using a surface area measuring device (product name "Flow Sorb II 2300" commercially available from Micromeritics Instrument Corp.).

Comparative Example 1

A polishing composition was prepared in the same procedure as in Example 1 except that no metal salt A was used.

For the polishing compositions according to respective examples, the type and the concentration C1 of the metal salt A, the concentration C2 of the oxidant, the concentration ratio C1/C2, and the pH are summarized in Table 1.

<Evaluation of Polishing Removal Rate>

The prepared polishing composition was directly used as a polishing liquid, and polishing was performed on the surface of the SiC wafer on which preliminary polishing was performed in advance using the polishing liquid containing the alumina abrasive under the following conditions. Regarding the SiC wafer, a SiC wafer having an off angle of 4° with respect to the C axis of the main surface (0001) was used, and the Si side was polished. Then, a polishing removal rate was calculated according to the following calculation formulae (1) and (2). The results are shown in the appropriate column of Table 1.

$$\text{Polishing removal [cm]} = \text{a difference in weight of an object to be polished before and after polishing [g]/density of SiC [g/cm}^3\text{] (=3.21 g/cm}^3\text{)/polishing target area [cm}^2\text{] (=19.62 cm}^2\text{)} \quad (1)$$

$$\text{Polishing removal rate [nm/h]} = \text{polishing removal [cm]} \times 10^7/\text{polishing time(=1 hour)} \quad (2)$$

[Polishing Conditions]

Polishing machine: Single-side polishing machine, model "EJ-380IN-CH" manufactured by Engis Japan Corporation Polishing pad: "SUBA800XY" manufactured by Nitta Haas Incorporated Polishing pressure: 29.4 kPa Platen rotational speed: 80 rpm Polishing time: 1 hour Head rotational speed: 40 rpm Flow rate of polishing liquid: 20 mL/minutes (used in one-way)

Temperature of polishing liquid: 25° C.

An object to be polished: SiC wafer (conductivity type: n-type, crystalline type 4H—SiC) 2 inch×3 sheets

TABLE 1

| | Metal salt A | | Oxidant | | | | Polishing |
| --- | --- | --- | --- | --- | --- | --- | --- |
| | Type | Conc. C1 (mol/L) | Type | Conc. C2 (mol/L) | Conc. ratio C1/C2 | pH | removal rate (nm/h) |
| Ex. 1 | Calcium nitrate | 0.0076 | $KMnO_4$ | 0.079 | 0.0962 | 5.5 | 1511 |
| Com. Ex. 1 | — | — | $KMnO_4$ | 0.079 | — | 5.6 | 1317 |

As illustrated in Table 1, in the polishing composition of Example 1 in which the metal salt A and the oxidant were used in combination, the polishing removal rate was improved compared to Comparative Example 1 in which the oxidant was used alone. Based on the results, it was confirmed that the polishing removal rate of the polishing composition could be improved using the metal salt A and the oxidant in combination.

Test Example 2

In this example, in order to confirm the effect of the content of the alumina abrasive on the polishing removal rate, the following test was performed.

Examples 2 to 5

Polishing compositions were prepared in the same procedure as in Example 1 except that the content of the alumina abrasive was changed as shown in Table 2.

Comparative Example 2

A polishing composition was prepared in the same procedure as in Example 1 except that no alumina abrasive was used.

For the polishing compositions of respective examples, a polishing removal rate was measured in the same procedure as in Test Example 1. The results are shown in the appropriate column of Table 2.

TABLE 2

|  | Content of alumina abrasive (%) | pH | Polishing removal rate (nm/h) |
|---|---|---|---|
| Ex. 1 | 6 | 5.5 | 1511 |
| Ex. 2 | 3 | 5.6 | 1570 |
| Ex. 3 | 12 | 5.6 | 1484 |
| Ex. 4 | 18 | 5.5 | 1359 |
| Ex. 5 | 1.5 | 5.6 | 1494 |
| Com. Ex. 2 | 0 | 5.8 | 591 |

As shown in Table 2, in the polishing compositions of Examples 1 to 5 containing the alumina abrasive, the polishing removal rate was greatly improved compared to Comparative Example 2 containing no alumina abrasive. In consideration of polishing removal rate, the content of the alumina abrasive was preferably 1% or more and 25% or less.

Test Example 3

In this example, in order to confirm the effect of the concentration $C1$ of the metal salt A and the concentration $C2$ of the oxidant on the polishing removal rate, the following test was performed.

Examples 6 to 11 and Example 17

Polishing compositions were prepared in the same procedure as in Example 1 except that the concentration $C1$ of the metal salt A and the concentration $C2$ of the oxidant were changed as shown in Table 3.

For the polishing compositions of respective examples, a polishing removal rate was measured in the same procedure as in Test Example 1. The results are shown in the appropriate column of Table 3.

TABLE 3

|  | Metal salt A | | Oxidant | | | | Polishing |
|---|---|---|---|---|---|---|---|
|  | Type | Conc. C1 (mol/L) | Type | Conc. C2 (mol/L) | Conc. ratio C1/C2 | pH | removal rate (nm/h) |
| Ex. 1 | Calcium nitrate | 0.0076 | KMnO$_4$ | 0.079 | 0.0962 | 5.6 | 1511 |
| Ex. 6 | Calcium nitrate | 0.0038 | KMnO$_4$ | 0.079 | 0.0481 | 5.5 | 1505 |
| Ex. 7 | Calcium nitrate | 0.0114 | KMnO$_4$ | 0.079 | 0.1443 | 5.5 | 1583 |
| Ex. 8 | Calcium nitrate | 0.0152 | KMnO$_4$ | 0.079 | 0.1924 | 5.5 | 1643 |
| Ex. 9 | Calcium nitrate | 0.0076 | KMnO$_4$ | 0.158 | 0.0481 | 5.6 | 1583 |
| Ex. 10 | Calcium nitrate | 0.0228 | KMnO$_4$ | 0.079 | 0.2886 | 5.5 | 1517 |
| Ex. 11 | Calcium nitrate | 0.0076 | KMnO$_4$ | 0.263 | 0.0289 | 5.6 | 1671 |
| Ex. 17 | Calcium nitrate | 0.0015 | KMnO$_4$ | 0.079 | 0.0190 | 5.6 | 1387 |
| Com. Ex. 1 | — | — | KMnO$_4$ | 0.079 | — | 5.6 | 1317 |

As shown in Table 3, the polishing removal rate tended to increase as the concentration $C1$ of the metal salt A and the concentration $C2$ of the oxidant increased. In consideration of polishing removal rate, the concentration $C1$ of the metal salt A was preferably 0.0035 mol/L or more. In addition, the concentration ratio $C1/C2$ of the concentration $C1$ of the metal salt A and the concentration $C2$ of the oxidant was preferably 0.001 or more.

Test Example 4

In this example, in order to confirm the effect of the type of the metal salt A on the polishing removal rate, the following test was performed.

Examples 12 to 16

Polishing compositions were prepared in the same procedure as in Example 1 except that the type and the concentration $C1$ of the metal salt A were changed as shown in Table 4.

For the polishing compositions of respective examples, a polishing removal rate was measured in the same procedure as in Test Example 1. The results are shown in the appropriate column of Table 4.

TABLE 4

| | Metal salt A | | Oxidant | | | | Polishing |
| --- | --- | --- | --- | --- | --- | --- | --- |
| | Type | Conc. C1 (mol/L) | Type | Conc. C2 (mol/L) | Conc. ratio C1/C2 | pH | removal rate (nm/h) |
| Ex. 12 | Calcium nitrate | 0.025 | $KMnO_4$ | 0.263 | 0.0951 | 5.4 | 1548 |
| Ex. 13 | Strontium chloride | 0.025 | $KMnO_4$ | 0.263 | 0.0951 | 5.5 | 1653 |
| Ex. 14 | Calcium chloride | 0.025 | $KMnO_4$ | 0.263 | 0.0951 | 5.5 | 1654 |
| Ex. 15 | Potassium chloride | 0.025 | $KMnO_4$ | 0.263 | 0.0951 | 5.5 | 1825 |
| Ex. 16 | Sodium chloride | 0.025 | $KMnO_4$ | 0.263 | 0.0951 | 5.6 | 1818 |
| Com. Ex. 1 | — | — | $KMnO_4$ | 0.079 | — | 5.6 | 1317 |

As shown in Table 4, in the polishing compositions of Examples 12 to 16 in which the metal salt A and the oxidant were used in combination, regardless of the type of the metal salt A, the polishing removal rate was improved compared to Comparative Example 1 in which the oxidant was used alone.

Test Example 5

In this example, using the polishing compositions of Example 1 and Comparative Example 1, surfaces of various different SiC wafers were polished. Specifically, polishing was performed on the surface of the SiC wafer on which preliminary polishing was performed in advance using the polishing liquid containing the alumina abrasive under the following conditions. Regarding the SiC wafer, a SiC wafer having an off angle of 4° with respect to the C axis of the main surface (0001) was used and the Si side was polished. In addition, a SiC wafer whose main surface (0001) was at 0° with respect to the C axis was used and the Si side and the C side were polished. Then, the polishing removal rate was calculated according to the calculation formulae (1) and (2). The results are shown in the appropriate column of Table 5.

[Polishing Conditions]
Polishing machine: model "PDP-500" manufactured by Fujikoshi Machinery Corp.
Polishing pad: "SUBA800XY" manufactured by Nitta Haas Incorporated
Polishing pressure: 29.4 kPa
Platen rotational speed: 100 rpm
Polishing time: 1 hour
Head rotational speed: 100 rpm
Flow rate of polishing liquid: 20 mL/minutes (used in one-way)
Temperature of polishing liquid: 25° C.
An object to be polished: SiC wafer (conductivity type: n-type, crystalline type 4H—SiC) 2 inch×1 sheet As shown in Table 5, in the polishing composition of Example 1 in which the metal salt A and the oxidant were used in combination, the polishing removal rate was improved compared to Comparative Example 1 in which the oxidant was used alone regardless of the plane and plane orientation of the SiC wafer. Among these, when a SiC wafer whose main surface (0001) was at 0° with respect to the C axis was used, a very high polishing removal rate improving effect of 1.3 times or more was obtained.

Test Example 6

In this example, in order to confirm the effect of the metal salt A on the surface of the wafer after polishing, the following test was performed.

Example 18

A polishing composition was prepared in the same procedure as in Example 1 except that the concentration C1 of the metal salt A and the concentration C2 of the oxidant were changed as shown in Table 6.

Comparative Example 3

A polishing composition was prepared in the same procedure as in Example 18 except that no metal salt A was used.

The SiC wafer was polished using the polishing compositions of Example 18 and Comparative Example 3. Specifically, polishing was performed on the surface of the SiC wafer on which preliminary polishing was performed in advance using the polishing liquid containing the alumina abrasive under the same conditions as in Test Example 5, and the surface after polishing was evaluated under the following conditions. Regarding the SiC wafer, a prime grade SiC wafer (conductivity type: n-type, crystalline type

TABLE 5

| | Metal salt A | | Oxidant | | | | Si side 4° off polishing | Si side 0° off polishing | C side 0° off polishing |
| --- | --- | --- | --- | --- | --- | --- | --- | --- | --- |
| | Type | Conc. C1 (mol/L) | Type | Conc. C2 (mol/L) | Conc. ratio C1/C2 | pH | removal rate (nm/h) | removal rate (nm/h) | removal rate (nm/h) |
| Ex. 1 | Calcium nitrate | 0.0076 | $KMnO_4$ | 0.079 | 0.0951 | 5.5 | 2191 | 1288 | 4082 |
| Com. Ex. 1 | — | — | $KMnO_4$ | 0.079 | — | 5.6 | 1809 | 842 | 3095 |

4H—SiC, commercially available from Dow Corning Toray Co., Ltd.) of 4 inches was used, and the Si side was polished. The results are shown in the appropriate column of Table 6.

[Evaluation Conditions of Surface after Polishing]
Evaluation device: commercially available from Lasertec Corporation, SiC wafer defect inspection/review device SICA6X
Evaluation value: total number of all defects (total number of defects)

TABLE 6

| | Metal salt A | | Oxidant | | | Total |
|---|---|---|---|---|---|---|
| | Type | Conc. C1 (mol/L) | Type | Conc. C2 (mol/L) | pH | number of defects |
| Ex. 18 | Calcium nitrate | 0.0152 | KMnO$_4$ | 0.105 | 5.6 | 15965 |
| Com. Ex. 3 | — | — | KMnO$_4$ | 0.105 | 5.6 | 33254 |

As shown in Table 6, in the polishing composition of Example 18, the total number of defects was reduced compared to Comparative Example 3 in which the oxidant was used alone. Based on the results, it was confirmed that, when the metal salt A and the oxidant were used in combination, it was possible to improve the quality of the surface and significantly improve the polishing removal rate.

Test Example 7

In this example, the following test was performed in order to confirm whether the metal salt A was effective in improving the polishing removal rate regardless of the type of the oxidant.

Examples 19 to 21

Polishing compositions were prepared in the same procedure as in Example 1 except that the concentration C1 of the metal salt A and the type of the oxidant were changed as shown in Table 7.

Comparative Example 4

A polishing composition was prepared in the same procedure as in Example 19 except that no metal salt A was used.

For the polishing compositions of respective examples, a polishing removal rate was measured in the same procedure as in Test Example 1 after polishing was performed under the same conditions as in Test Example 5, and a relative value (polishing removal rate ratio) was determined when the measurement result of Comparative Example 4 was set as 100.

TABLE 7

| | Metal salt A | | Oxidant | | | | Polishing |
|---|---|---|---|---|---|---|---|
| | Type | Conc. C1 (mol/L) | Type | Conc. C2 (mol/L) | Conc. ratio C1/C2 | pH | removal rate ratio |
| Ex. 19 | Calcium nitrate | 0.0015 | NaIO$_4$ | 0.079 | 0.0190 | 4.0 | 124 |
| Ex. 20 | Calcium nitrate | 0.0035 | NaIO$_4$ | 0.079 | 0.0443 | 4.0 | 150 |
| Ex. 21 | Calcium nitrate | 0.0228 | NaIO$_4$ | 0.079 | 0.2886 | 3.3 | 126 |
| Com. Ex. 4 | — | 0 | NaIO$_4$ | 0.079 | — | 5.1 | 100 |

As shown in Table 7, in the polishing compositions of Examples 19 to 21, the polishing removal rate was improved compared to Comparative Example 4 in which the oxidant was used alone. Based on the results, it was confirmed that, even if sodium periodate (NaIO$_4$) was used as the oxidant in polishing of the SiC wafer, it was possible to exhibit the polishing removal rate improving effect according to a combination of the metal salt A and the oxidant.

Test Example 8

In this example, various different compound semiconductor wafers were polished using the polishing compositions of Example 10 and Comparative Example 1. Specifically, polishing was performed on the surface of the semiconductor wafers on which preliminary polishing was performed in advance using the polishing liquid containing the alumina abrasive under the same conditions as in Test Example 5. In this example, regarding the polishing target surface, the a side of sapphire (Al$_2$O$_3$), the N side of gallium nitride (GaN), and the Si side of silicon carbide (SiC) were polished. Then, the polishing removal rate was calculated according to the calculation formulae (1) and (2). Here, in calculation of the polishing removal rate of sapphire, "SiC density [g/cm$^3$] (=3.21 g/cm$^3$)" in the calculation formula (1) was replaced with "sapphire density [g/cm$^3$] (=3.97 g/cm$^3$)." In addition, in calculation of the polishing removal rate of gallium nitride, "SiC density [g/cm$^3$] (=3.21 g/cm$^3$)" was replaced with "gallium nitride density [g/cm$^3$] (=6.15 g/cm$^3$)." The results are shown in the appropriate column of Table 8.

TABLE 8

| | Metal salt A | | Oxidant | | Conc. ratio C1/C2 | pH | $Al_2O_3$ a side polishing removal rate (nm/h) | GaN N side polishing removal rate (nm/h) | SiC Si side polishing removal rate (nm/h) |
|---|---|---|---|---|---|---|---|---|---|
| | Type | Conc. C1 (mol/L) | Type | Conc. C2 (mol/L) | | | | | |
| Ex. 10 | Calcium nitrate | 0.0228 | $KMnO_4$ | 0.079 | 0.2886 | 5.5 | 24 | 8949 | 1959 |
| Com. Ex. 1 | — | — | $KMnO_4$ | 0.079 | — | 5.6 | 0 | 7917 | 1809 |

As shown in Table 8, in the polishing composition of Example 10 in which the metal salt A and the oxidant were used in combination, in polishing of each of the SiC wafer, the GaN wafer and the $Al_2O_3$ wafer, the polishing removal rate was improved compared to Comparative Example 1 in which the oxidant was used alone. In particular, in the SiC wafer and the GaN wafer made of a material not containing oxygen as a constituent element, a polishing removal rate of 1,900 nm/h or more was obtained. This was thought to have been caused by the fact that, in polishing of a material not containing oxygen as a constituent element, the object to be polished was altered due to the oxidant, the altered layer was removed, and thus polishing proceeded. That is, it was thought that, in polishing of the $Al_2O_3$ wafer that had already been oxidized, the metal salt A functioned only in the removal process, and on the other hand, in polishing of the SiC wafer and the GaN wafer, since the metal salt A functioned in both the wafer oxidation process and removal process, a higher polishing removal rate was obtained.

Test Example 9

In this example, in order to confirm the effect of the concentration C1 of the metal salt A on the polishing removal rate of the GaN wafer, the following test was performed.

Examples 22 and 23

Polishing compositions were prepared in the same procedure as in Example 1 except that the concentration C1 of the metal salt A was changed as shown in Table 9.

For the polishing compositions of Examples 1, 10, 22, and 23 and Comparative Example 1, polishing was performed under the same conditions as in Test Example 5, and the polishing removal rate was measured in the same procedure as in Test Example 1. Here, in this test example, the same GaN wafer as in Test Example 8 was used as a compound semiconductor wafer as an object to be polished, and the N side of the GaN wafer was polished. The results are shown in the appropriate column of Table 9.

As shown in Table 9, in the polishing compositions of Examples 1, 22, and 23, as in the polishing composition of Example 10, in polishing of the GaN wafer, a polishing removal rate was improved compared to Comparative Example 1 in which the oxidant was used alone. In addition, among Examples 1, 10, 22, and 23, in Examples 1 and 23, a higher polishing removal rate was obtained. In consideration of polishing removal rate, the concentration C1 of the metal salt A was preferably 0.0035 mol/L or more. In addition, the concentration ratio C1/C2 of the concentration C1 of the metal salt A and the concentration C2 of the oxidant was preferably 0.001 or more.

While specific examples of the present invention have been described above in detail, these are only examples, and do not limit the scope of the claims. The techniques recited in the claims include various modifications and alternations of the specific examples exemplified above.

The invention claimed is:

1. A polishing composition to be used in polishing an object to be polished, the polishing composition comprising:
    water, an abrasive, an oxidant, and a polishing removal accelerator, wherein
    the polishing composition contains at least one metal salt selected from the group consisting of an alkali metal salt and an alkaline earth metal salt as the polishing removal accelerator,
    the oxidant includes a metal element containing oxidant, and
    a concentration C1 [mol/L] of the metal salt and a concentration C2 [mol/L] of the oxidant in the polishing composition satisfy all of the following relationships:
    $0.0035 \leq C1$;
    $0.001 \leq C2 \leq 3$; and
    $0.001 \leq C1/C2 \leq 0.2$.
2. The polishing composition according to claim 1, wherein
    the oxidant includes a composite metal oxide, and
    the composite metal oxide includes a monovalent or divalent metal element other than transition metal elements, and a transition metal element in the fourth period in the periodic table.

TABLE 9

| | Metal salt A | | Oxidant | | Conc. ratio C1/C2 | pH | Polishing removal rate (nm/h) |
|---|---|---|---|---|---|---|---|
| | Type | Conc. C1 (mol/L) | Type | Conc. C2 (mol/L) | | | |
| Ex. 22 | Calcium nitrate | 0.0035 | $KMnO_4$ | 0.079 | 0.0443 | 5.6 | 9449 |
| Ex. 1 | Calcium nitrate | 0.0076 | $KMnO_4$ | 0.079 | 0.0962 | 5.6 | 10973 |
| Ex. 23 | Calcium nitrate | 0.0122 | $KMnO_4$ | 0.079 | 0.1544 | 5.5 | 10563 |
| Ex. 10 | Calcium nitrate | 0.0228 | $KMnO_4$ | 0.079 | 0.2886 | 5.5 | 8949 |
| Com. Ex. 1 | — | — | $KMnO_4$ | 0.079 | — | 5.6 | 7917 |

3. The polishing composition according to claim 1, wherein
the abrasive is alumina particles.

4. The polishing composition according to claim 1, wherein
the oxidant is potassium permanganate.

5. The polishing composition according to claim 1, wherein
the oxidant is sodium periodate.

6. The polishing composition according to claim 1, wherein
a material constituting the object to be polished has a Vickers hardness of 1,500 Hv or more.

7. The polishing composition according to claim 1, wherein
a material constituting the object to be polished is silicon carbide.

8. The polishing composition according to claim 1, wherein
a material constituting the object to be polished is gallium nitride.

9. The polishing composition according to claim 1, wherein the metal salt is chloride or nitrate.

10. The polishing composition according to claim 1, wherein
the metal salt is at least one selected from the group consisting of sodium chloride, potassium chloride, calcium chloride, strontium chloride, sodium nitrate, potassium nitrate, calcium nitrate, and strontium nitrate.

11. The polishing composition according to claim 1, wherein
the concentration C2 [mol/L] of the oxidant is 0.05 mol/L or more and 0.5 mol/L or less.

12. A polishing method comprising:
supplying the polishing composition according to claim 1 to an object to be polished and polishing the object to be polished.

13. The method according to claim 12, wherein
the material constituting the object to be polished has a Vickers hardness of 1,500 Hv or more.

14. The method according to claim 12, wherein
the material constituting the object to be polished is silicon carbide.

15. The method according to claim 12, wherein
the material constituting the object to be polished is gallium nitride.

* * * * *